(12) United States Patent
Sharma et al.

(10) Patent No.: US 8,368,462 B2
(45) Date of Patent: Feb. 5, 2013

(54) METHOD, SYSTEM, AND APPARATUS FOR RF SWITCHING AMPLIFIER

(75) Inventors: Vikas Sharma, Elgin, IL (US); Jaroslaw Adamski, Streamwood, IL (US); Neil Calanca, Crown Point, IN (US); Robert Broughton, Chester, NH (US)

(73) Assignee: Peregrine Semiconductor Corporation, San Diego, CA (US)

( * ) Notice: Subject to any disclaimer, the term of this patent is extended or adjusted under 35 U.S.C. 154(b) by 229 days.

(21) Appl. No.: 12/924,907

(22) Filed: Oct. 6, 2010

(65) Prior Publication Data

US 2012/0086512 A1   Apr. 12, 2012

(51) Int. Cl.
    *H03F 3/38*   (2006.01)
(52) U.S. Cl. .............. 330/10; 330/149; 330/310
(58) Field of Classification Search .......... 330/10, 330/149, 310
    See application file for complete search history.

(56) References Cited

U.S. PATENT DOCUMENTS

| | | | |
|---|---|---|---|
| 4,528,517 A | 7/1985 | Schlotzhauer | |
| 5,331,221 A | 7/1994 | Ganesan et al. | |
| 5,732,334 A * | 3/1998 | Miyake | 455/126 |
| 6,630,867 B2 | 10/2003 | Canyon et al. | |
| 6,636,114 B2 * | 10/2003 | Tsutsui et al. | 330/51 |
| 6,646,511 B2 | 11/2003 | Canyon et al. | |
| 6,853,244 B2 * | 2/2005 | Robinson et al. | 330/51 |
| 7,173,491 B2 | 2/2007 | Bocock et al. | |
| 7,202,712 B2 | 4/2007 | Athas | |
| 7,202,734 B1 | 4/2007 | Raab | |
| 7,248,120 B2 | 7/2007 | Burgener et al. | |
| 7,457,594 B2 | 11/2008 | Theobold et al. | |
| 7,489,196 B2 | 2/2009 | Vaiana et al. | |
| 7,545,216 B2 | 6/2009 | Hamley | |
| 7,551,032 B2 | 6/2009 | Dupuis et al. | |
| 7,551,036 B2 | 6/2009 | Berroth et al. | |
| 7,586,376 B2 * | 9/2009 | Litmanen | 330/305 |
| 7,639,068 B2 | 12/2009 | Mizuno et al. | |
| 7,679,433 B1 | 3/2010 | Li | |
| 7,786,807 B1 | 8/2010 | Li et al. | |
| 7,817,966 B2 | 10/2010 | Prikhodko et al. | |
| 7,868,683 B2 | 1/2011 | Ilkov | |
| 7,961,052 B2 | 6/2011 | Bacon et al. | |
| 8,093,945 B2 * | 1/2012 | Wimpenny | 330/129 |
| 8,106,711 B2 | 1/2012 | Adamski et al. | |
| 8,111,104 B2 | 2/2012 | Ahadian et al. | |
| 8,131,251 B2 | 3/2012 | Burgener et al. | |
| 2002/0171486 A1 | 11/2002 | Krupnik | |
| 2007/0018718 A1 * | 1/2007 | Horng et al. | 330/10 |
| 2007/0229156 A1 | 10/2007 | Alenin et al. | |
| 2008/0246543 A1 | 10/2008 | Trifonov et al. | |
| 2012/0007679 A1 | 1/2012 | Burgener et al. | |
| 2012/0194274 A1 * | 8/2012 | Fowers et al. | 330/293 |

OTHER PUBLICATIONS

Choe, Henry, Office Action from the USPTO dated Sep. 13, 2011 for related U.S. Appl. No. 13/008,711, 13 pgs.
Nguyen, Hieu, Notice of Allowance from the USPTO dated Sep. 20, 2011 for related U.S. Appl. No. 12/590,839, 13 pgs.
Nguyen, Hieu, Notice of Allowance from the USPTO dated Sep. 29, 2011 for related U.S. Appl. No. 12/657,727, 14 pgs.
Tran, Pablo N., Notice of Allowance from the USPTO dated Oct. 6, 2011 for related U.S. Appl. No. 11/501,125, 11 pgs.

(Continued)

*Primary Examiner* — Patricia Nguyen
(74) *Attorney, Agent, or Firm* — Jaquez & Associates; Martin J. Jaquez, Esq.; Merle W. Richman, Esq.

(57) ABSTRACT

Embodiments of RF switching amplifiers are described generally herein. Other embodiments may be described and claimed.

20 Claims, 6 Drawing Sheets

OTHER PUBLICATIONS

Choe, Henry, Notice of Allowance from the USPTO dated Oct. 14, 2011 for related U.S. Appl. No. 12/799,910, 23 pgs.
Nguyen, Khanh V., Office Action from the USPTO dated Nov. 4, 2011 for related U.S. Appl. No. 12/807,365, 14 pgs.
Adamski, et al., Response filed in the USPTO dated Dec. 13, 2011 for related U.S. Appl. No. 13/008,711, 5 pgs.
Nguyen, Khanh V., Office Action from USPTO dated Apr. 5, 2012 for related U.S. Appl. No. 12/807,365, 10 pgs.
Nguyen, Hieu P., Office Action from the USPTO for related U.S. Appl. No. 12/657,727 dated Jun. 10, 2011, 12 pgs.
Choe, Henry, Office Action from the USPTO for related U.S. Appl. No. 12/657,728 dated Jun. 15, 2011, 4 pgs.
Tran, Pablo N., Notice of Allowance from the USPTO dated May 19, 2011 for related U.S. Appl. No. 11/501,125, 11 pgs.
Choe, Henry, Notice of Allowance from the USPTO dated Aug. 2, 2012 for related U.S. Appl. No. 13/008,711, 15 pgs.
Burgener, et al., Response filed in the USPTO dated Aug. 3, 2012 for related U.S. Appl. No. 12/903,848, 5 pgs.
Choe, Henry, Notice of Allowance from the USPTO dated Jan. 10, 2012 for related U.S. Appl. No. 13/008,711, 10 pgs.
Tran, Pablo, N., Office Action from the USPTO dated Feb. 3, 2012 for related U.S. Appl. No. 12/903,848, 46 pgs.
Nguyen, Khanh V., Notice of Allowance received from the USPTO dated Sep. 6, 2012 for related U.S. Appl. No. 12/807,365, 13 pgs.
Tran, Pablo No., Notice of Allowance received from the USPTO dated Oct. 26, 2012 for related U.S. Appl. No. 12/903,848, 14 pgs.
Choe, Henry, Notice of Allowance received from the USPTO dated Nov. 1, 2012 for related U.S. Appl. No. 12/657,728, 10 pgs.

\* cited by examiner

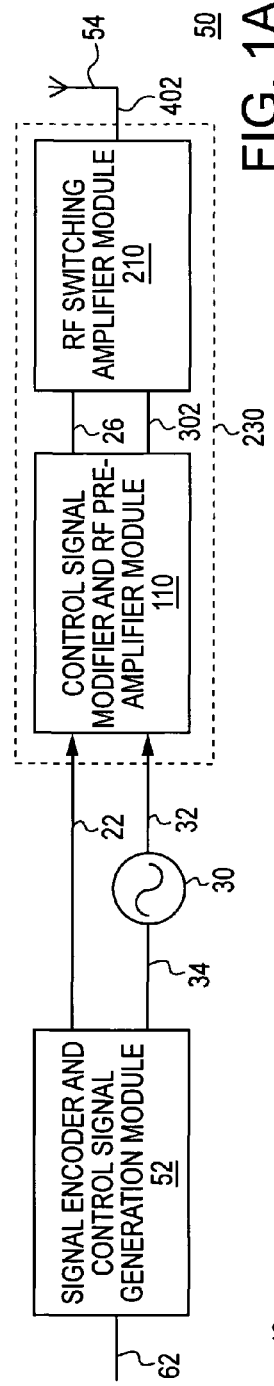
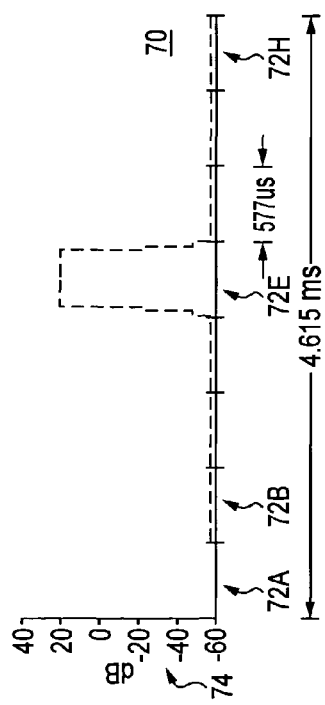
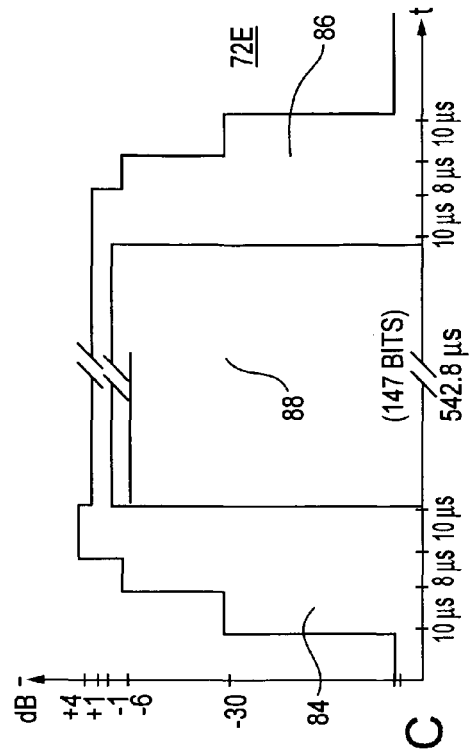
FIG. 1A
FIG. 1B
FIG. 1C

METHOD, SYSTEM, AND APPARATUS FOR RF SWITCHING AMPLIFIER

FIELD

Various embodiments described herein relate generally to switching amplifiers, including systems, and methods used in RF switching amplifiers.

BACKGROUND

It may be desirable to reduce switching power amplifiers adjacent channel leakage, the present disclosure provides such reduction.

BRIEF DESCRIPTION OF THE DRAWINGS

FIG. 1A is a simplified block diagram of RF signal generation architecture according to various embodiments.

FIG. 1B is a simplified diagram of an RF channel configuration according to various embodiments.

FIG. 1C is a simplified diagram of an RF channel slot configuration according to various embodiments.

DETAILED DESCRIPTION

Figure 2:
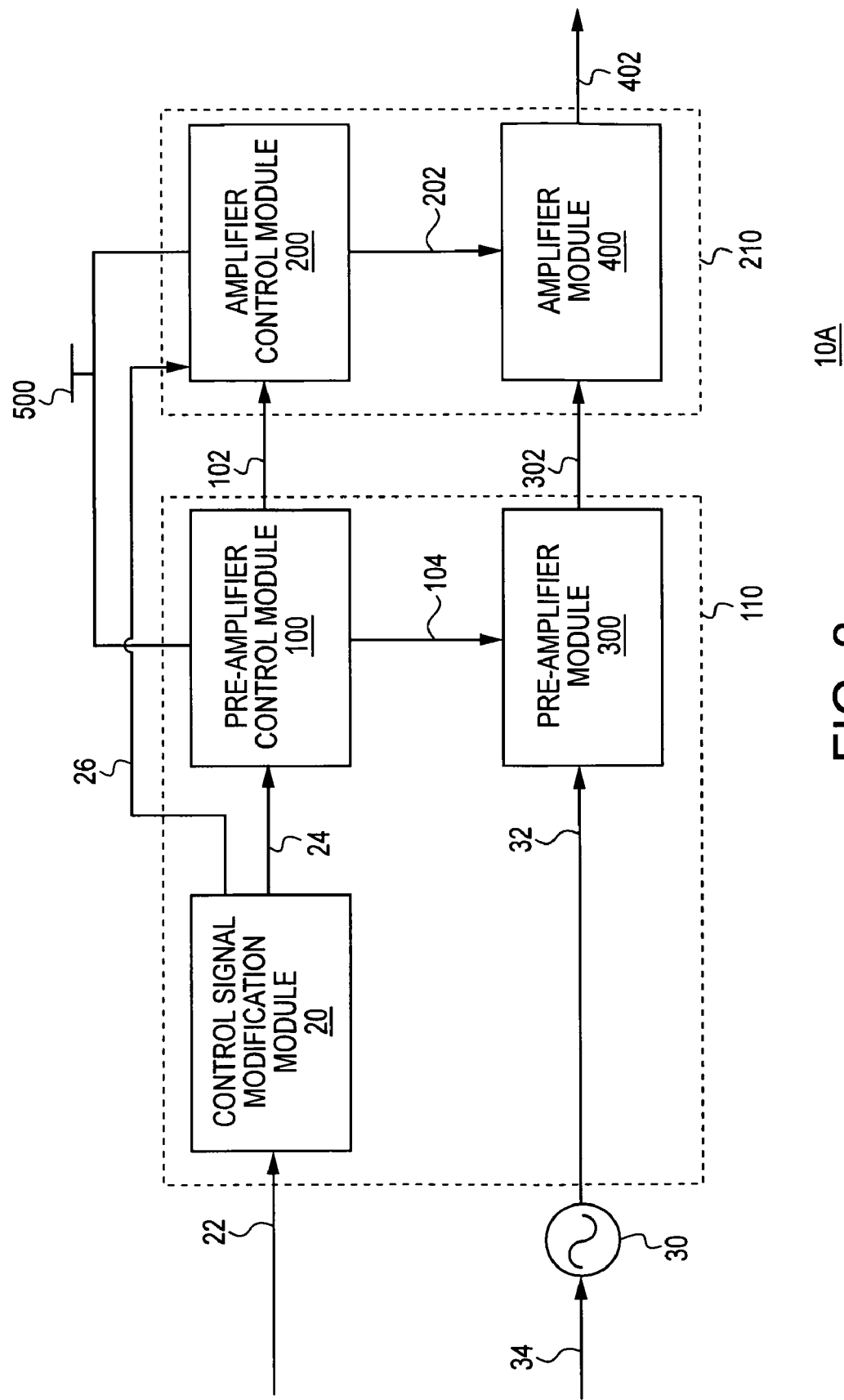
FIG. 2 is a block diagram of an RF switching amplifier system according to various embodiments.

FIG. 1A is a simplified block diagram of RF signal generation architecture 50 according to various embodiments. As shown in FIG. 1A, the architecture 50 includes a signal encoder and gain control signal generation (SEC) module 52, a gain control signal modifier and RF pre-amplifier module 110, and an RF switching amplifier (RSA) module 210. The signal encoder and gain control signal generation (SEC) module 52 may receive signals 62 to be transmitted on an RF network including a cellular, satellite, or local network. The SEC module 52 may generate a digitally encoded signal 34 and RF amplifier gain or ramp signal 22. The gain control signal modifier and RF pre-amplifier module 110 may modify the amplifier gain signal 22 and pre-amplify the encoded signal based on the amplifier gain signal 22.

The RSA module 210 may receive the pre-amplified encoded signal 302 and an amplifier gain signal 26. The RSA module 210 may further amplify the encoded signal 302 to generate the encoded, amplified RF signal 402 to be transmitted on a network based on the amplifier gain signal 26. The resultant amplified, RF modulated encoded signal 402 may be radiated on a network via an antenna 54. In an embodiment the amplifier gain signal 22 may direct the system 50 to generate the RF encoded, amplified signal during specific, micro time intervals. The gain signal modifier and RF pre-amplifier module 110 may amplify the pre-amplified signal 302 only during the specific micro time intervals. The RSA module 210 may receive the time limited pre-amplified signal and further amplify the signal only during the specific micro time intervals based on the amplifier gain signal 22.

The module 110 and module 210 form a micro-burst transmitter 230. In an embodiment the micro-burst transmitter 230 may be required to have a very low noise floor (signal outside the micro time intervals) and high gain relative to the low noise floor. Further the amplifier module 210 may have a higher noise floor that is effectively masked by the lower noise floor of the pre-amplifier module 110. Accordingly, even if the RSA 210 amplifies signals 302 beyond the desired micro time intervals (as set by the amplifier gain signal 22) the pre-amplifier module 110 may generate a signal 302 having no potential signal leakage (desired noise floor) outside the micro-time interval. In some radio systems the above mentioned noise floor may be referred to as the residual RF power.

In one embodiment, the amplifier gain signal 22 may regulate signal amplification based on network specifications. FIG. 1B is a simplified diagram of an RF channel configuration 70 according to various embodiments. The radio frequency (RF) channel configuration 70 includes eight channels or slots 72A to 72H where the total channel length is about 4.615 ms and each slot 72A to 72H is about 577 μs (micro time interval or micro burst signal). In FIG. 1B, architecture 50 may be assigned slot or channel 72E for RF signal generation. As shown in FIG. 1B, architecture 50 may be required to have minimal signal leakage between slots, a noise floor of less than about 54 to 59 dB outside the micro burst slot and an active micro burst slot signal having an amplitude from about 4 db to 30 dB (72E). In such an embodiment, the amplifier gain signal 22 may direct the modules 110, 210 (micro burst transmitter 230) to actively amplify an encoded signal only during the time slot 72E while meeting the leakage or floor requirements.

The pre-amplifier 110 module and RSA module 210 (micro burst transmitter 230) work cooperatively to amplify a signal during the limited time slot or micro-burst while providing minimal signal outside the time slot (noise floor). In an embodiment, the pre-amplifier module 110 may active a high frequency switch that limits signal content outside one or more desired time slots. Such a configuration may enable the RSA module 210 to amplify desired signals to required gain levels while preventing leakage prevalent in high frequency switching amplifiers.

The system 50 may be employed in a cellular network such as a GSM (Global System for Mobile Communications: originally from Groupe Spécial Mobile). A GSM cellular network may assign a fixed number of channels for cellular communications where each channel has a fixed number of time slots assignable for data or voice communication (time division multiple access) TDMA. In one GSM specification, 124 or 174 RF channels may share bandwidth from 935 to 960 MHz or 925 to 960 MHz (in extended GSM). Each channel 70 may have eight TDMA time slots assignable for data or voice communication 72A to 72H.

FIG. 1C is a detailed diagram of an RF channel slot 76E and a required RF signal power profile or envelope according to various embodiments (signal floor and gain). In a GSM cellular network and in other networks devices communicating on the network via one or more assigned slots of one or more channels a device may be required to limit their signal content outside their assigned time slots (leakage, minimum noise floor) while providing a variable strength high gain RF signal during their time slot. In networks, bandwidth may be limited and access to the bandwidth may be government regulated and costly. In order to maximum signal or data transmission in limited bandwidth networks, a short amplification gain ramp up window (about 18 μs preceding the 542.8 μs data signal in FIG. 1C) and an equally short amplification gain ramp down window (about 18 μs after the 542.8 μs data signal in FIG. 1C) may be imposed. In an embodiment the RF amplifier gain or ramp signal may coordinate or control the gain of the encoded data signal 34 to meet or exceed the gain and adjacent slot leakage (floor) requirements of the respective network. Some networks may also employ discontinuous transmission (DTX) protocols, requiring signal gain to be ramped down during gaps in speech or data communication.

FIG. 2 is a block diagram of an RF switching amplifier system 10A according to various embodiments that may be employed to generate an RF signal 402 for an encoded data signal 34 where system 10A may transmit the RF signal during the specific micro time intervals. The RF switching amplifier system 10A may include an RF modulator 30, a gain signal modifier and RF pre-amplifier module 110, an RSA module 210, and a power source 500. The gain signal modifier and RF pre-amplifier module 110 may include a gain signal modification module 20, a pre-amplifier gain control module 100, and a pre-amplifier module 300. The RSA module 210 may include an amplifier gain control module 200 and an amplifier module 400.

The gain signal modification module 20 may receive the RF amplifier gain signal 22 and generate a first RF pre-amplifier gain signal 24 and a first RF amplifier gain signal 26. In an embodiment, the gain signal modification module 20 may add a first bias to the gain signal 22 to generate the first RF pre-amplifier gain signal 24 and a second bias to the gain signal 22 to generate the first RF amplifier gain signal 26.

The RF modulator 30 may modulate an encoded digital signal 34 for one or more RF channels or frequencies as required or requested by a network or system associated with the RF switching amplifier system 10A. The pre-amplifier gain control module 100 may create a second RF pre-amplifier gain signal 104 based on the received first RF pre-amplifier gain signal 24. The module 100 may also generate a bias signal 102. The amplifier gain control module 200 may generate a second RF amplifier gain signal 202 based on the bias signal 102 and the first RF amplifier gain signal 26. The RF pre-amplifier module 300 may pre-amplify the RF modulated signal 32 based on the received second RF pre-amplified gain signal 104 to generate a pre-amplified RF modulated signal 302. As noted the pre-amplified module may be able to limit signal outside the desired amplification window (have desire noise floor) (as set by the amplification gain signal 22) where the RF modulator 30 operates continuously. The power source 500 may be an internal or external power source including a battery or capacitor.

The amplifier module 400 may further amplify the pre-amplified RF modulated signal 302 based on the second RF amplifier gain signal 202 to generate the RF, amplified signal 402. In one embodiment, the pre-amplifier module 300 may generate a ratio of the overall desired signal amplification as a function of the amplification ramp time, amplification level, and underlying physical structure, electronics, digital signal processors, and related electronic components while limiting signal outside the desired amplification window or slot. In conjunction, the amplifier modules 300, 400 may provide desired variable gain while limiting signal leakage (signal content outside the assigned window or slot).

Figure 3A:
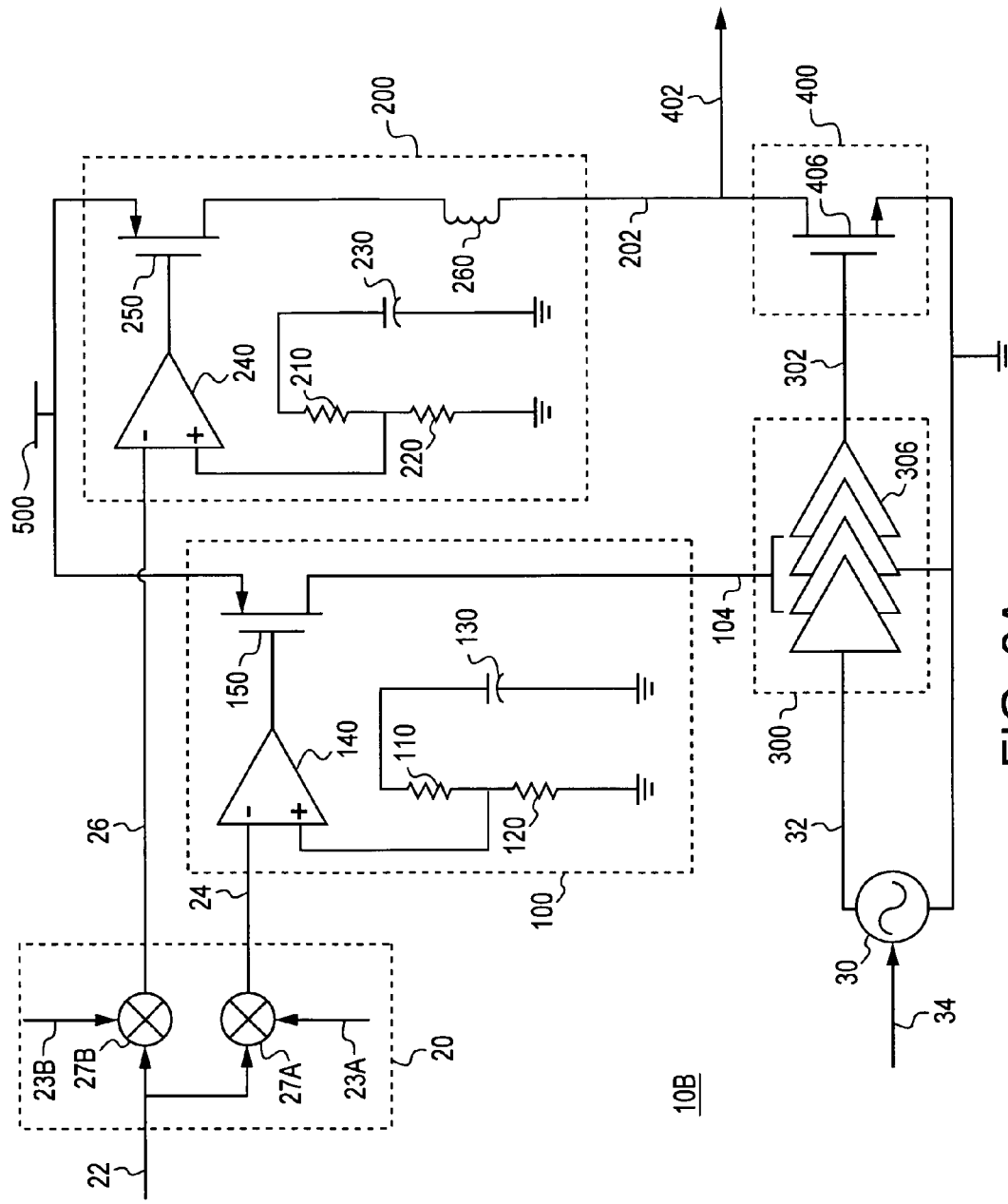
FIG. 3A is a diagram of an RF switching amplifier system according to various embodiments.

FIG. 3A is a diagram of an RF switching amplifier system 10B according to various embodiments that may be employed to generate an RF signal 402 for an encoded data signal 34 where system 10B may transmit the RF signal during specific time intervals. The RF switching amplifier system 10B may include a gain signal modification module 20, a pre-amplifier gain control module 100, an amplifier gain control module 200, an RF modulator 30, a pre-amplifier module 300, an amplifier module 400, and a power source 500. The gain signal modification module 20, the pre-amplifier gain control module 100, and the pre-amplifier module 300 may form the gain signal modifier and RF pre-amplifier module 110. The amplifier gain control module 200 and the amplifier module 400 may form the RSA module 210.

In one embodiment, the gain signal modification module 20 may include a first summer 27A and a second summer 27B. The first summer 27A may sum the gain signal 22 and a first bias signal 23A to generate the first RF pre-amplifier gain signal 24. The second summer 27B may sum the gain signal 22 and a second bias signal 23B to generate the first RF amplifier gain signal 26. The pre-amplifier gain control module 100 may include an operational amplifier 140, a p-type complementary metal-oxide-semiconductor P-CMOS transistor 150, a first resistor 110, a second resistor 120, and a capacitor 130. The operational amplifier (op-amp) 140 receives the first RF pre-amplifier gain signal 24 on one port and is coupled to the circuit formed by the first resistor 110, second resistor 120, and the capacitor 130 on a second port. The first RF pre-amplifier gain signal 24 limits the op-amp activity to about the desired window(s) or time slot(s).

The op-amp 140 output is coupled to the CMOS transistor 150 gate. The CMOS transistor 150 source is coupled to the power source 500. In an embodiment, the power source may provide a 3.4 or 5 volt signal. The CMOS transistor 150 drain may be coupled to the pre-amplifier module 300 via the second pre-amplifier gain signal 104. Accordingly, the P-CMOS transistor 150 may limit energy generation as a function the op-amp 140 activity and the corresponding first RF pre-amplifier gain signal 24. The RF modulator 30 may modulate an encoded digital signal 34 to one or more RF channels or frequencies as required or requested by a network or system associated with the RF switching amplifier system 10B. The pre-amplifier module 300 may include a multiple stage amplifier 306. The amplifier 306 may amplify the RF modulated signal 32 based on the second RF pre-amplifier gain signal 104. The multiple stage amplifier 306 provides limited gain and limits signal content beyond the desired window(s) or time slot(s) based on the gain signal 104.

The amplifier gain control module 200 may also include an op-amp 240, a P-CMOS transistor 250, a first resistor 210, a second resistor 220, a capacitor 230, and an inductor 260. The op-amp 240 receives the first RF amplifier gain signal 26 on one port and is coupled to the circuit formed by the first resistor 210, second resistor 220, and the capacitor 230 on the second port. The op-amp 240 output is coupled to the P-CMOS transistor 250 gate. The CMOS transistor 250 source is coupled to the power source 500. The CMOS transistor 250 drain may be coupled to the amplifier module 400 via the inductor 260. Similarly to the op-amp 140, the op-amp 240 signal generation (provided to the P-CMOS transistor 250) is limited by the first RF amplifier gain signal 26. Accordingly, the P-CMOS transistor 250 drain 204 may limit the operation of the amplifier module 400 based on the RF gain signal 22.

The amplifier module 400 may include an N-type CMOS transistor 406. The N-CMOS transistor 406 gate is coupled to the pre-amplifier module 300 and receives the pre-amplified RF modulated signal 302. The N-CMOS transistor 406 source is coupled to ground. The N-CMOS transistor 406 drain is coupled to the amplifier controller module 200 P-CMOS transistor 250 drain via the inductor 260. The amplified RF modulated signal 402 is provided at the N-type CMOS transistor 406 drain. In one embodiment, the N-CMOS transistor 406 may have a large signal leakage from its gate to drain due to large device size and corresponding large gate to drain capacitance. The transistor 406 accordingly may have residual power outside a desired RF burst time slot. While the N-CMOS may operate beyond a desired window or slot, the signal 302 at the gate is effectively clamped by the lower power pre-amplifier module 300 (N-CMOS transistor 406 boosts a negligible signal outside the desired window or slot).

In one embodiment the capacitors 130, 230 may limit spikes due to control amplification signal switching frequency. The capacitors may range from 100 to 400 picofarads (pF). The resistor combination may reduce energy consumption by optimizing the gain between the pre-amplifier module 300 and the amplifier module 400. Given the gate signal to the N-CMOS transistor 406 is also minimized, the N-CMOS transistor 406 energy consumption is also optimized while providing improved dynamic range.

In one embodiment, the amplifier module 400 may have a maximum output of about 3.4V and the pre-amplifier module 300 may have a maximum output of about 2.1V. Further, the amplifier gain signal 22 may have a range of about 0 to 1.7 volts. The resistors 110, 120, 210, 220 values may be related. The resistors 110, 120, 210, 220 may have the following values 2A, 1A, 2B, and 1B, respectively. In an embodiment the resistors values may meet the following equations: a) $1A/(2A+1A)=1.7V/2.1V$; and b) $1B/(2B+1B)=1.7V/3.4V$ when i. the amplifier gain signal maximum is about 1.7V; ii. the amplifier module 400 maximum output is about 3.4V; and iii. the pre-amplifier module 300 maximum output is about 2.1V.

Figure 6:
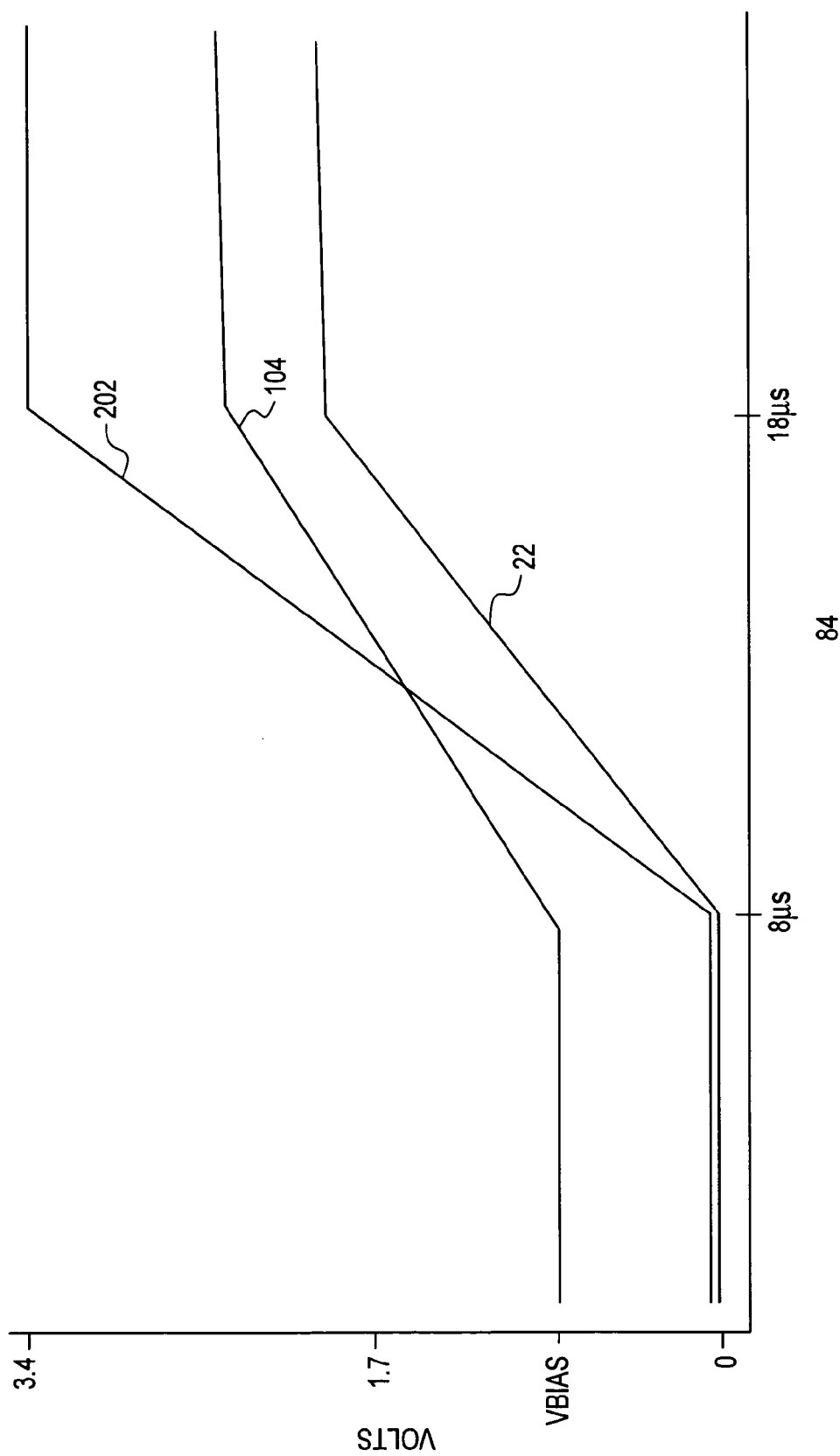
FIG. 6 are plots of signals according to various embodiments.

As noted above, the gain signal modification module 20 may add a bias signal 23A, 23B to the amplifier gain signal. In one embodiment, the pre-amplifier gain control module 100 and the amplifier gain control module 200 threshold voltage may be approximately 450 mV. The vbias signals 23A, 23B may be set to the threshold voltage. As shown in FIG. 6, during the start of a slot or window the RF control amplifier signal 22 may be about zero for a time interval, the second pre-amplifier gain signal 104 may be about vbias, and the second amplifier gain signal may be about zero. Thereafter the RF amplifier gain signal 22 may ramp up to about 1.7 volts, the second pre-amplifier gain signal 104 may reach about 2.1 Volts, and the second amplifier gain signal 202 may reach about 3.4 volts. The preamplifier module 300 may have a threshold gain control voltage 104 of about 450 mV. Setting the bias voltage 23A so that the minimum 104 gain control voltage is approximately the threshold voltage may enable the system to achieve a smooth change of RF output 402 relative to the input ramp voltage 22. A simple CMOS implementation of the preamplifier module 300 is a CMOS inverter that is well know to those skilled art.

Figure 5:
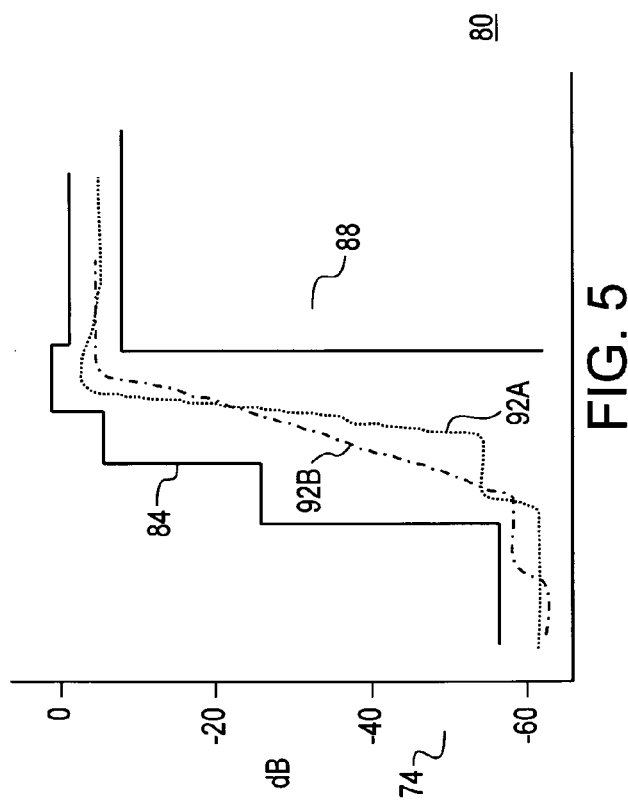
FIG. 5 is a partial diagram of an RF amplification ramps according to various embodiments.

FIG. 5 is a partial diagram 80 of an RF amplification ramps according to various embodiments that may be achieved with the gain signals shown in FIG. 6. As shown in FIG. 5, RF signal power level may be required to fit between the envelopes 84, 88. In a system without a pre-amplifier gain control module 100 and a pre-amplifier 300, the RF signal power level may be similar to the profile 92A shown in FIG. 5. The RF signal power level may be similar to the profile 92B where the signal has a linear ramp up to a desired maximum voltage with little or no overshoot or adjacent channel leakage.

Figure 3B:
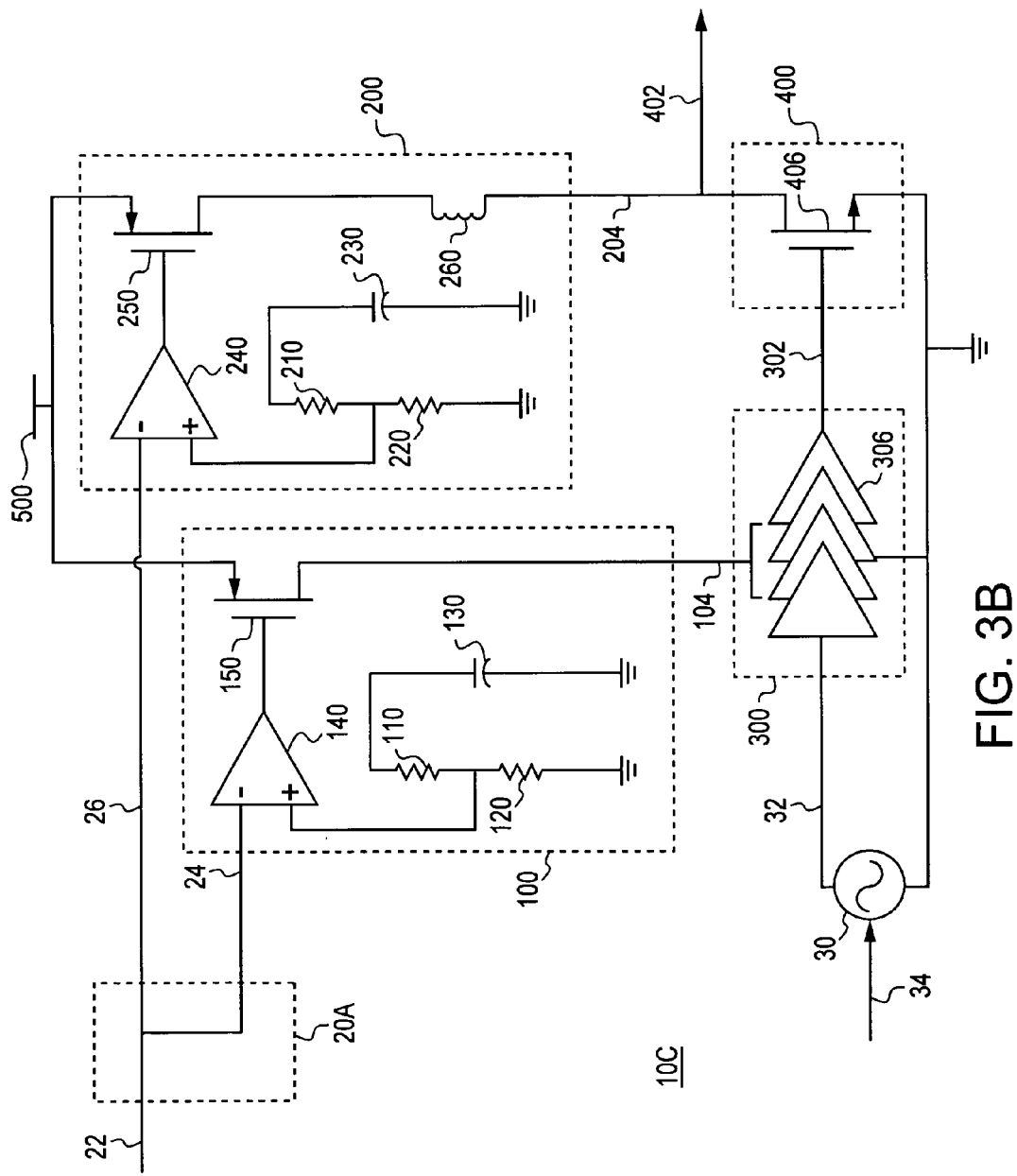
FIG. 3B is another diagram of an RF switching amplifier system according to various embodiments.
Figure 4:
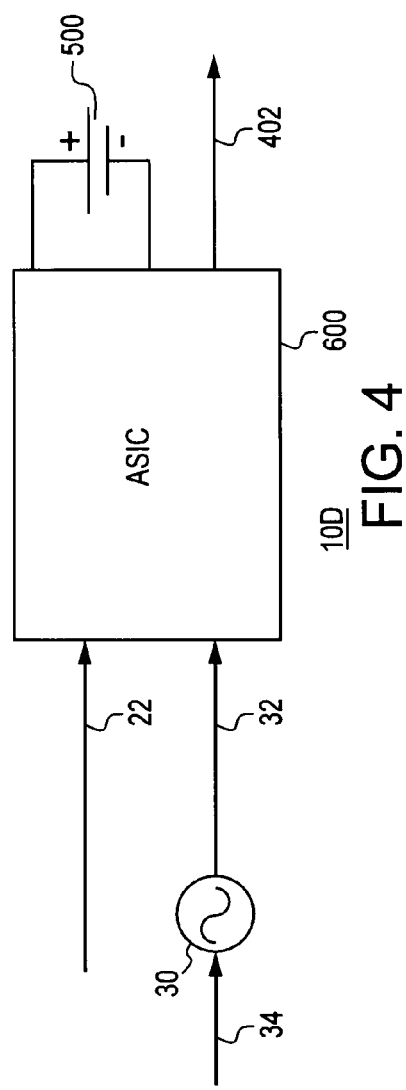
FIG. 4 is another diagram of an RF switching amplifier system according to various embodiments.

FIG. 3B is schematic diagram of another RF switching amplifier system 10C according to various embodiments. The system 10C is similar to system 10B with exception of the gain signal modification module 20A. In system 10C, the amplifier gain signal 22 is provided directly to the pre-amplifier gain control module 100 and the amplifier gain control module 200. FIG. 4 is another diagram of an RF switching amplifier system 10D according to various embodiments. The system 10D may include an application specific integrated circuit (ASIC) 600, RF modulator 30, and an external power source 500. In an embodiment the ASIC 600 may include the components of the gain signal modification module 20, pre-amplifier gain control module 100, amplifier gain control module 200, pre-amplifier module 300, and the amplifier module 400 as shown in FIG. 3A and FIG. 3B.

The apparatus and systems of various embodiments may be useful in applications other than a sales architecture configuration. They are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

It may be possible to execute the activities described herein in an order other than the order described. Various activities described with respect to the methods identified herein can be executed in repetitive, serial, or parallel fashion.

A software program may be launched from a computer-readable medium in a computer-based system to execute functions defined in the software program. Various programming languages may be employed to create software programs designed to implement and perform the methods disclosed herein. The programs may be structured in an object-orientated format using an object-oriented language such as Java or C++. Alternatively, the programs may be structured in a procedure-orientated format using a procedural language, such as assembly or C. The software components may communicate using a number of mechanisms well known to those skilled in the art, such as application program interfaces or inter-process communication techniques, including remote procedure calls. The teachings of various embodiments are not limited to any particular programming language or environment.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived there-from, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. An apparatus for amplifying an RF modulated signal for transmission on a network having micro-burst transmission slots and having a minimum noise floor, including:
    a gain signal module for receiving an RF signal amplification gain signal and generating a first pre-amplifier gain signal and a first amplifier gain signal;
    a pre-amplifier module for receiving a first pre-amplifier gain signal and amplifying an RF modulated signal during a specific transmission slot based on the first pre-amplifier gain signal with a first noise floor outside the specific transmission slot;
    an amplifier module for receiving a first amplifier gain signal and further amplifying the RF modulated signal during the specific transmission slot based on the first amplifier gain signal with a second noise floor outside the specific transmission slot;
    wherein the second noise floor is greater than the first noise floor and the first noise floor is less than the minimum noise floor.

2. The apparatus of claim 1, further including a pre-amplifier gain control module for receiving a first pre-amplifier gain signal and generating a second pre-amplifier signal, the pre-amplifier module for receiving a second pre-amplifier gain signal and amplifying an RF modulated signal based on the second amplifier gain signal.

3. The apparatus of claim 2, further including an amplifier gain control module for receiving a first amplifier gain signal and generating a second amplifier signal, the amplifier module for receiving a second amplifier gain signal and amplifying an RF modulated signal based on the second amplifier gain signal.

4. The apparatus of claim 1, the amplifier module including at least one transistor.

5. The apparatus of claim 2, the pre-amplifier gain control module including at least one transistor.

6. The apparatus of claim 3, the amplifier gain control module including at least one transistor.

7. The apparatus of claim 1, the amplifier module including at least one CMOS transistor.

8. The apparatus of claim 3, the amplifier module including at least one CMOS transistor, the pre-amplifier gain control module including at least one CMOS transistor, and the amplifier gain control module including at least one CMOS transistor.

9. The apparatus of claim 3, the amplifier module including at least one N-type CMOS transistor, the pre-amplifier gain control module including at least one P-type CMOS transistor, and the amplifier gain control module including at least one P-type CMOS transistor.

10. The apparatus of claim 3, wherein the network is a GSM cellular network.

11. A method of amplifying an RF modulated signal for transmission on a network having time limited transmission slots and having a minimum noise floor, including:
    employing a gain signal module to receive an RF signal amplification gain signal and generate a first pre-amplifier gain signal and a first amplifier gain signal;
    employing a pre-amplifier module to receive a first pre-amplifier gain signal and amplify an RF modulated signal during a specific transmission slot based on the first pre-amplifier gain signal with a first noise floor outside the specific transmission slot;
    employing an amplifier module to receive a first amplifier gain signal and further amplify the RF modulated signal during the specific transmission slot based on the first amplifier gain signal with a second noise floor outside the specific transmission slot;
    wherein the second noise floor is greater than the first noise floor and the first noise floor is less than the minimum noise floor.

12. The method of claim 11, further including employing a pre-amplifier gain control module to receive a first pre-amplifier gain signal and generate a second pre-amplifier signal and employing the pre-amplifier module to receive a second pre-amplifier gain signal and amplify an RF modulated signal based on the second amplifier gain signal.

13. The method of claim 12, further including employing an amplifier gain control module to receive a first amplifier gain signal and generate a second amplifier signal and employing the amplifier module to receive a second amplifier gain signal and amplify an RF modulated signal based on the second amplifier gain signal.

14. The method of claim 11, wherein the amplifier module includes at least one transistor.

15. The method of claim 12, wherein the pre-amplifier gain control module includes at least one transistor.

16. The method of claim 3, wherein the amplifier gain control module includes at least one transistor.

17. The method of claim 11, wherein the amplifier module includes at least one CMOS transistor.

18. The method of claim 13, wherein the amplifier module includes at least one CMOS transistor, the pre-amplifier gain control module includes at least one CMOS transistor, and the amplifier gain control module includes at least one CMOS transistor.

19. The method of claim 13, wherein the amplifier module includes at least one N-type CMOS transistor, the pre-amplifier gain control module includes at least one P-type CMOS transistor, and the amplifier gain control module includes at least one P-type CMOS transistor.

20. The method of claim 13, wherein the network is a GSM cellular network.

* * * * *